(12) United States Patent
Lee et al.

(10) Patent No.: US 12,191,556 B2
(45) Date of Patent: Jan. 7, 2025

(54) INTEGRATED SWITCH FOR IMPROVED CLOSED MODE WIRELESS PERFORMANCE

(71) Applicant: Dell Products L.P., Round Rock, TX (US)

(72) Inventors: Zhong-Chao Lee, Tainan (TW); I-Yu Chen, Taipei (TW); Ching-Cheng Hsu, Taipei (TW)

(73) Assignee: Dell Products L.P., Round Rock, TX (US)

( * ) Notice: Subject to any disclaimer, the term of this patent is extended or adjusted under 35 U.S.C. 154(b) by 446 days.

(21) Appl. No.: 17/711,086

(22) Filed: Apr. 1, 2022

(65) Prior Publication Data

US 2023/0318164 A1 Oct. 5, 2023

(51) Int. Cl.
*H01Q 1/22* (2006.01)
*H03H 7/38* (2006.01)

(52) U.S. Cl.
CPC ............ *H01Q 1/2266* (2013.01); *H03H 7/38* (2013.01)

(58) Field of Classification Search
CPC .............................. H01Q 1/2266; H03H 7/38
See application file for complete search history.

(56) References Cited

U.S. PATENT DOCUMENTS

2018/0343000 A1* 11/2018 Nosaka .................... H03H 9/72
2023/0138278 A1* 5/2023 Moon ...................... H04B 1/50
455/552.1

* cited by examiner

*Primary Examiner* — Renan Luque
(74) *Attorney, Agent, or Firm* — Terrile, Cannatti & Chambers, LLP; Stephen A. Terrile

(57) ABSTRACT

A closed mode switch mechanism. The closed mode switch mechanism includes an antenna controller; an antenna coupled to the antenna controller; and, an antenna closed mode switch system coupled to the antenna controller and the antenna, the antenna closed mode switch system providing antenna impedance matching for the antenna when an information handling system is configured in a closed mode of operation.

10 Claims, 12 Drawing Sheets

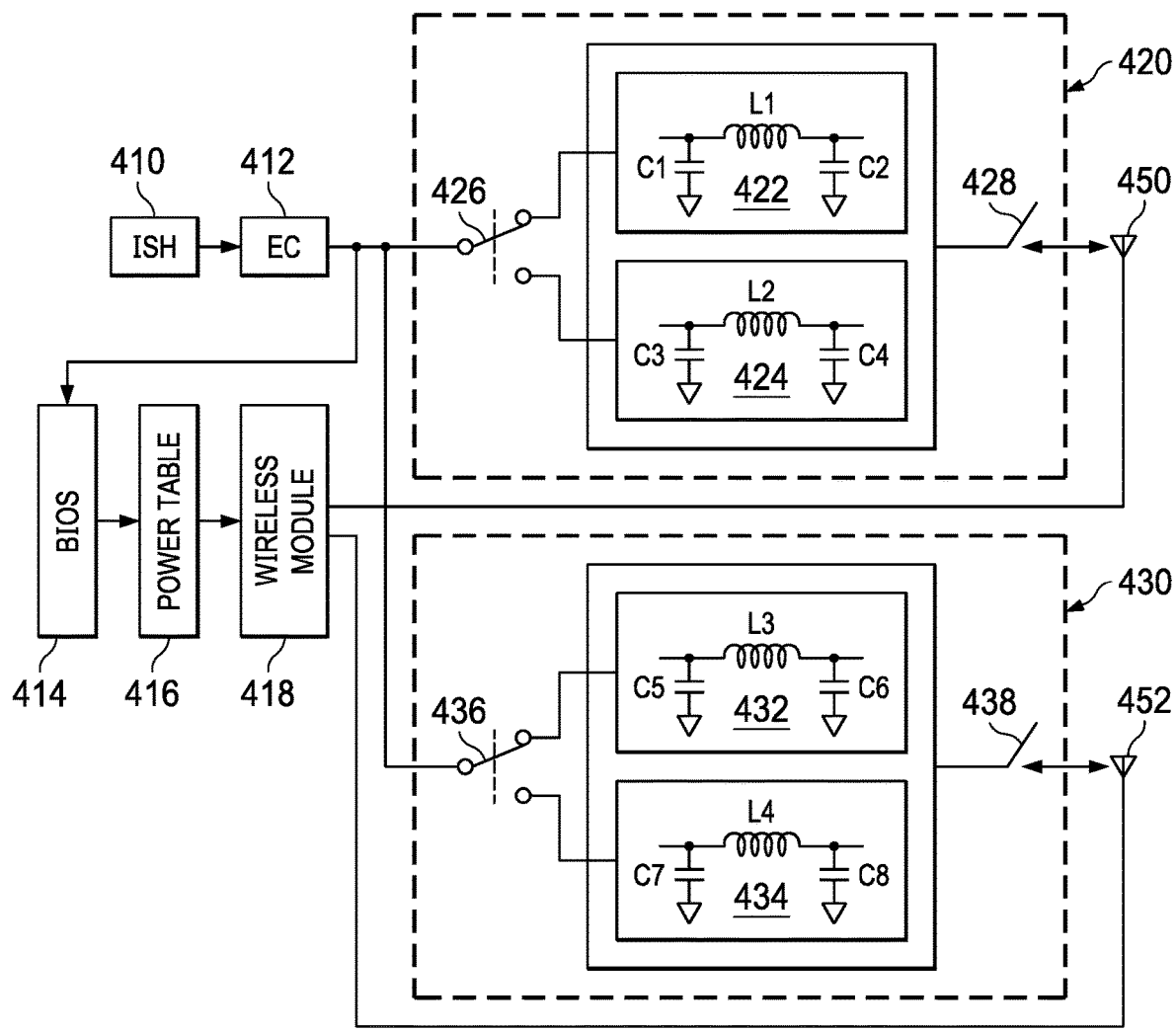
FIG. 4
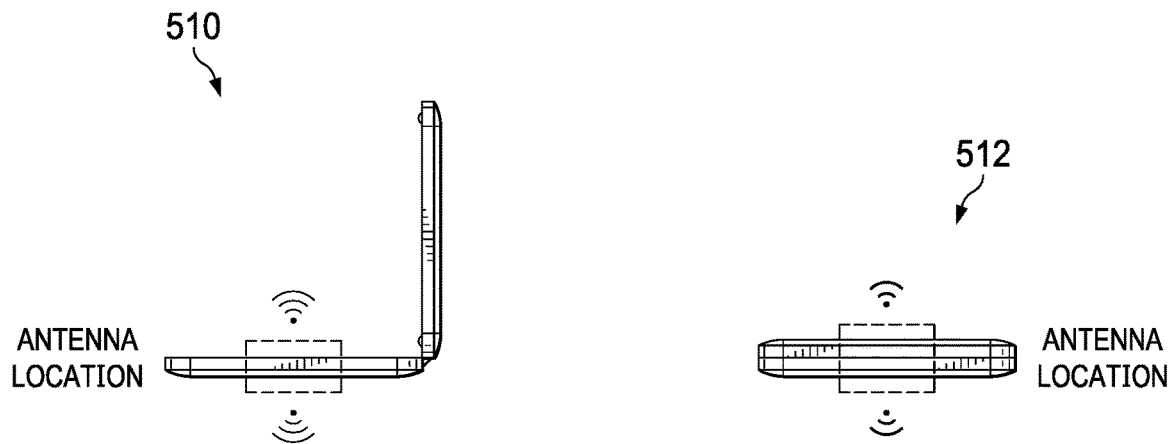
FIG. 5A
FIG. 5B

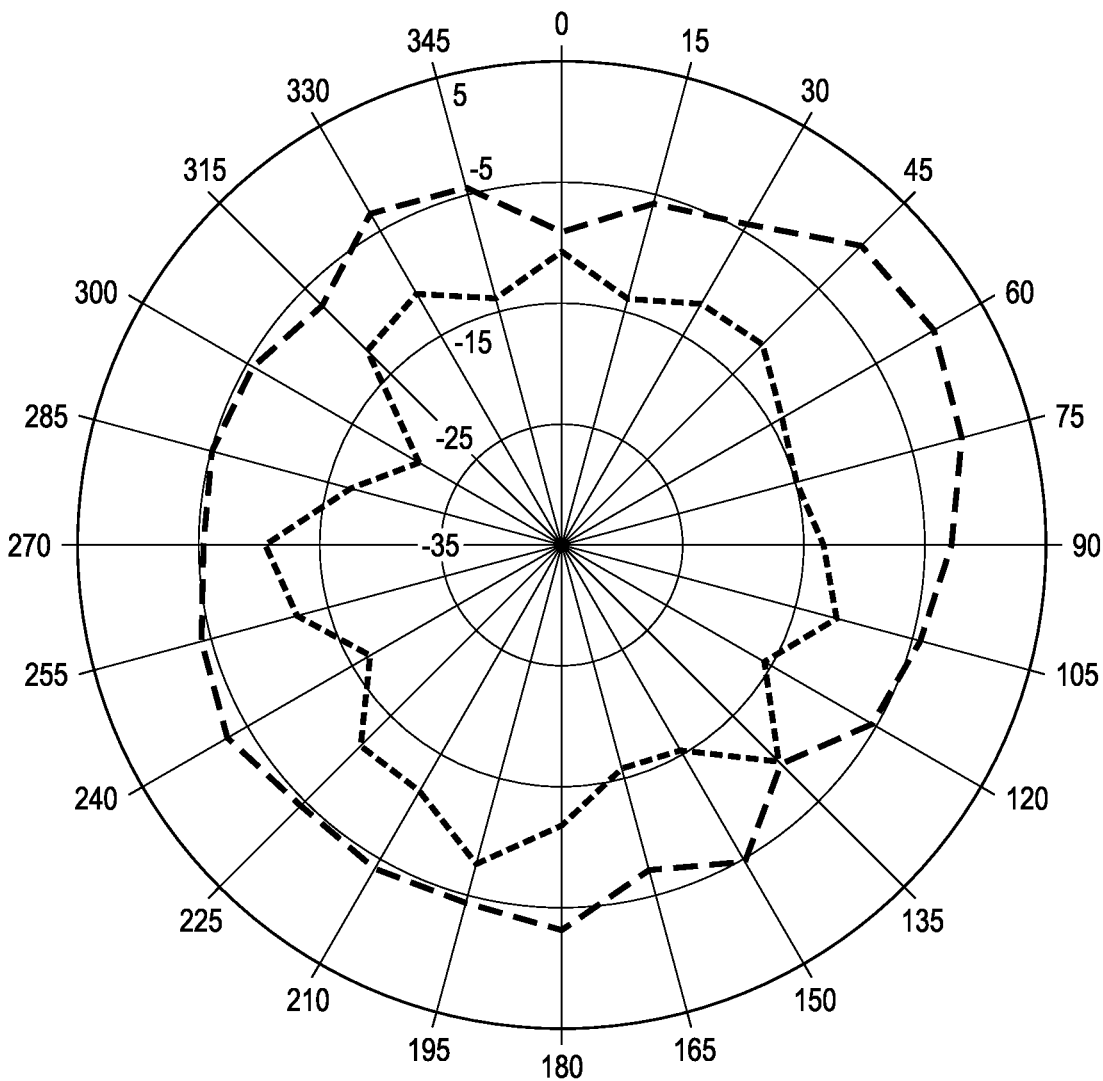
XY CUT
- – – – OPEN MODE
- - - - - - CLOSED MODE
- ——— CLOSED MODE WITH MATCHING CIRCUIT
FIG. 7A
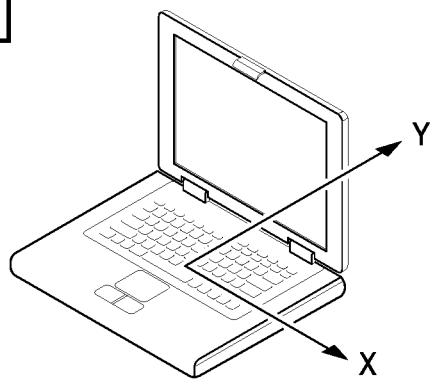

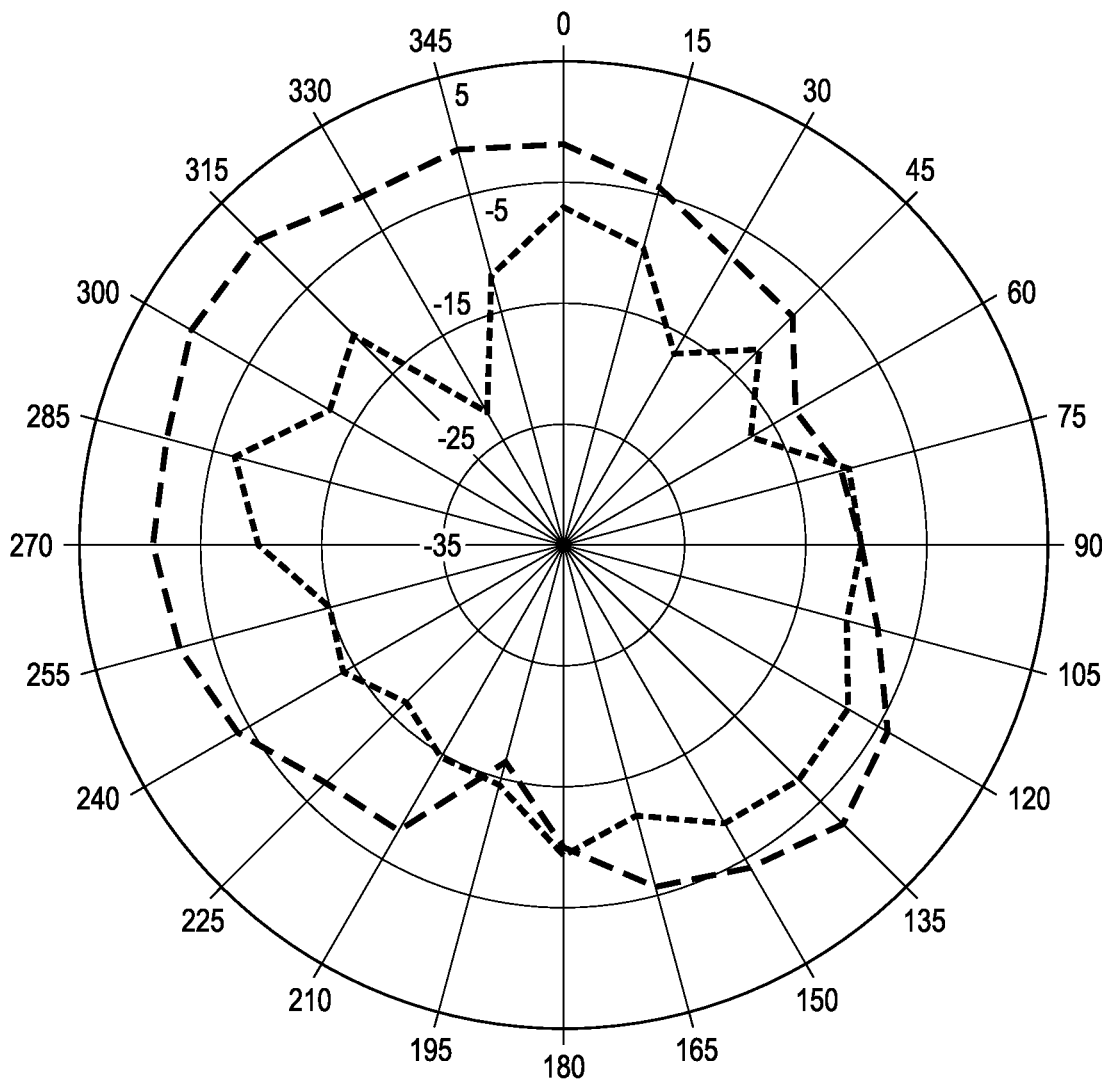
XZ CUT
- - - - OPEN MODE
- - - - - - CLOSED MODE
———— CLOSED MODE WITH MATCHING CIRCUIT
FIG. 8A
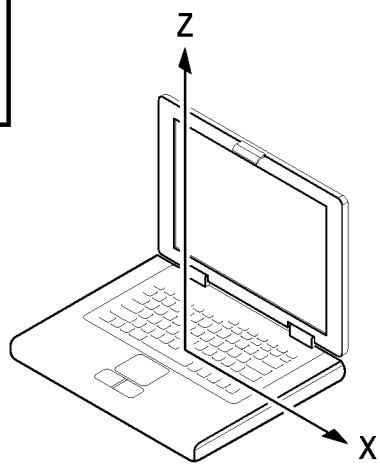

INTEGRATED SWITCH FOR IMPROVED CLOSED MODE WIRELESS PERFORMANCE

BACKGROUND OF THE INVENTION

Field of the Disclosure

The present disclosure generally relates to information handling systems, and more particularly relates to a wireless subsystem used within an information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

For purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, read-only memory (ROM), and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communications between the various hardware components. The information handling system may also include telecommunication, network communication, and video communication capabilities. The information handling system may also include one or more buses operable to transmit communications between the various hardware components. The information handling system may also include telecommunication, network communication, and video communication capabilities. Information handling system chassis parts may include case portions such as for a laptop information handling system including the C-cover over components designed with a metal structure. The information handling system may be configurable with one or more antenna systems located within the chassis.

SUMMARY

In one embodiment, the invention relates to an information handling system (IHS) which includes an integrated switch for improved closed mode wireless performance.

More specifically, in one embodiment, the invention relates to a closed mode switch mechanism comprising: an antenna controller; an antenna coupled to the antenna controller; and, an antenna closed mode switch system coupled to the antenna controller and the antenna, the antenna closed mode switch system providing antenna impedance matching for the antenna when an information handling system is configured in a closed mode of operation.

In another embodiment, the invention relates to a system comprising: a host portion, the host portion comprising a processor; and, a data bus coupled to the processor; and an antenna system, the antenna system comprising an antenna controller; an antenna coupled to the antenna controller; and, an antenna closed mode switch system coupled to the antenna controller and the antenna, the antenna closed mode switch system providing antenna impedance matching for the antenna when an information handling system is configured in a closed mode of operation.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 4 shows a block diagram of an integrated closed mode switch mechanism information handling system environment according to an embodiment of the present disclosure.

FIGS. 5A and 5B show diagrammatic views of an information handling system wireless performance in an open mode of operation and a closed mode of operation.

FIGS. 7A and 7B show examples of antenna performance along an X Y axis in an open mode of operation and a closed mode of operation according to an embodiment of the present disclosure.

FIGS. 8A and 8B show examples of antenna performance along an X Z axis in an open mode of operation and a closed mode of operation according to an embodiment of the present disclosure.

DETAILED DESCRIPTION

Figure 1:
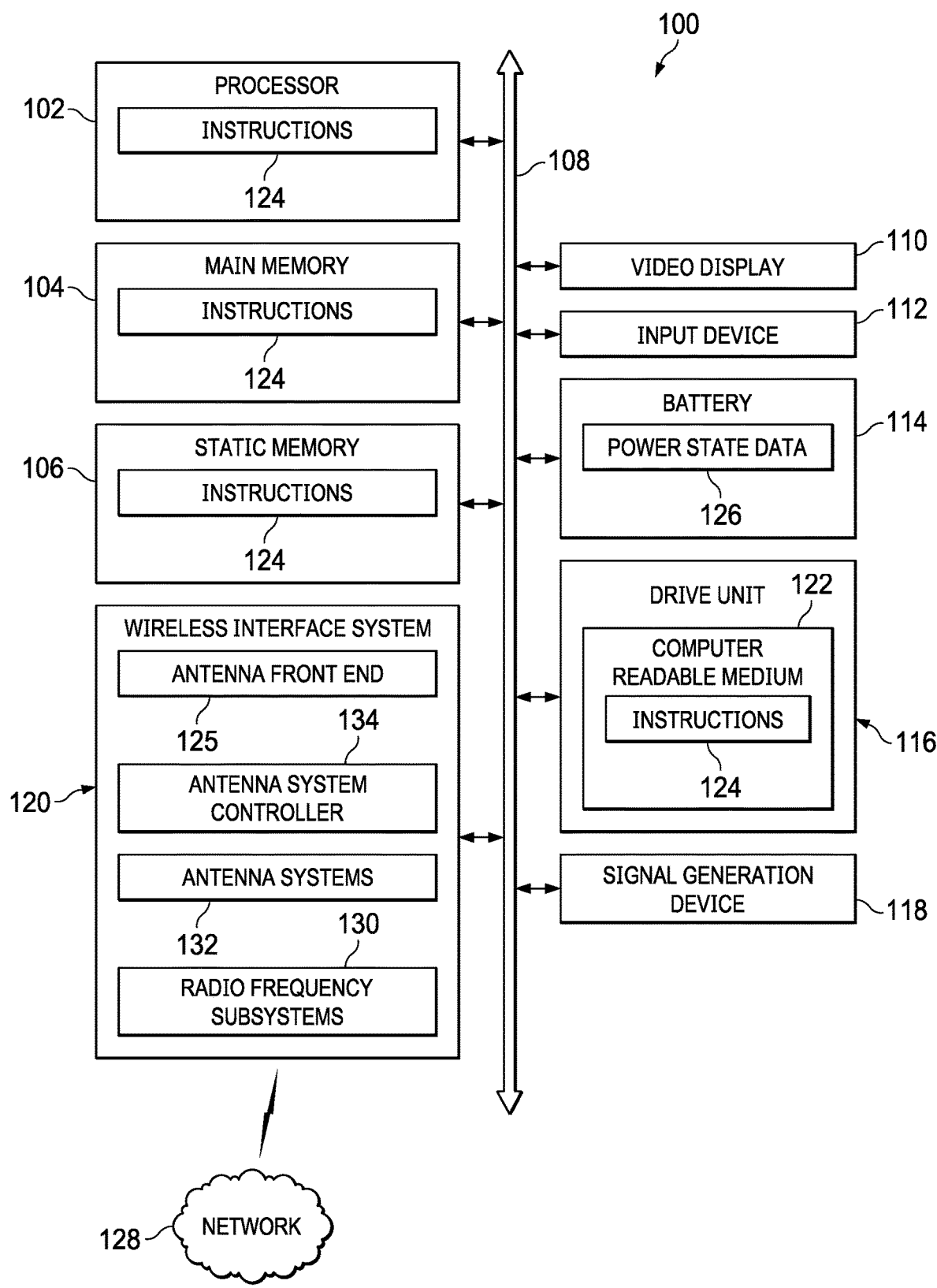
FIG. 1 shows a general illustration of components of an information handling system as implemented in an embodiment of the system and method of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

Various aspects of the present disclosure include an appreciation that with certain portable information handling system usage, more and more users are using their portable information handling system in a closed mode of operation (i.e., a lid-closed mode) such as when the portable information handling system is positioned on a surface and then connected to either a display devise or attached to a dock such as a thunderbolt type dock. With many known portable information handling systems it is desirable to have a narrow bezel for the display chassis (often referred to as the B cover). Such a narrow bezel often results in the antenna being positioned in the base chassis of the portable information handling system. Various aspects of the present disclosure include an appreciation that such an antenna location can result in degraded wireless performance due to antenna impedance matching which is mis-matched in the closed mode of operation. Various aspects of the present disclosure include an appreciation that known portable information handling system designs do not focus on improvement of lid-closed wireless performance, as compared to opened and tablet modes of operation.

Accordingly, an integrated closed mode switch mechanism is disclosed which provides antenna impedance matching when the information handling system is operating in a closed mode of operation. In certain embodiments, the integrated closed mode switch mechanism includes one or more single pole double throw (SPDT) switches (or a double pole double throw (DPDT) switch) and a plurality of tuning circuits which are triggered when the information handling system is in an opened mode of operation or a closed mode of operation. In certain embodiments, the switch(es) are triggered by an integrated sensor hub when the information handling system is opened or closed. With such an integrated closed mode switch mechanism, regardless of whether the system is operating in an opened mode of operation or a closed mode of operation, the antenna is always impedance matched.

Such an integrated closed mode switch mechanism provides an integrated switch/tuning mechanism antenna solution which improves negative lid-closed wireless user experience. Such an integrated closed mode switch mechanism provides improvement on antenna gain up to 5 dB at certain angels, also the orientation to recover nulls. Such an integrated closed mode switch mechanism results in no significant information handling system electrical design impact. In various embodiments, this integrated closed mode switch mechanism is extended from a known hardware architecture. In various embodiments, the switch and tuning circuits are integrated into antenna itself, resulting in no significant mechanical engineering/industrial design (ME/ID) impact. Usually modifying an antenna design would cause an ME/ID impact from antenna in the Y-dimension of the information handling system (thus resulting in a thicker system) whereas adding the switch and matching circuit to the antenna only slightly increases antenna X-dimension (thus maintaining the thickness of the overall information handling system.

For aesthetic, strength, and performance reasons, information handling system chassis parts may be designed with a metal structure. In an embodiment, a laptop information handling system, for example, may include a plurality of covers for the interior components of the information handling system. In these embodiments, a form factor case may include an "A-cover" which serves as a back cover for a display housing and a "B-cover" which may serve as the bezel, if any, and a display screen of the convertible laptop information handling system in an embodiment. In a further example, the laptop information handling system case may include a "C-cover" housing a keyboard, touchpad, and any cover in which these components are set and a "D-cover" base housing for the laptop information handling system.

With the need for utility of lighter, thinner, and more streamlined devices, the use of full metal portions for the outer covers of the display and base housing (e.g., the A-cover and the D-cover) is desirable for strength as well as aesthetic reasons. At the same time, the demands for wireless operation also increase. This includes addition of many simultaneously operating radiofrequency (RF) systems, addition of more antennas, and utilization of various antenna types. In the present specification and in the appended claims, the term "radio frequency" is meant to be understood as the oscillation rate of an electromagnetic wave. A specific frequency of an electromagnetic wave may have a wavelength that is equal to the speed of light (~300,000 km/s) divided by the frequency.

With new types of networks being developed such as 5G networks, additional antennas that operate on frequencies related to those 5G networks (i.e., high frequency (HF) band, very high frequency (VHF) band, ultra-high frequency (VHF) band, L band, S band, C band, X band, Ku band, K band, Ka band, V band, W band, and millimeter wave bands). So as to communicate with the existing networks as well as the newly developed networks, additional antennas may be added to an information handling system. However, the thinner and more streamlined devices have fewer locations and area available for mounting RF transmitters on these mobile information handling systems. Within the information handling system, suitable locations for these RF systems and antennas besides the A-cover and B-covers are sought. This may lead to placing the RF systems and antennas in the C-cover or D-cover of the information handling systems.

Another consequence of using metal covers is the excitation of the metal surfaces of the covers described herein. This excitation of the metal surfaces leads to destructive interference in the signals sent by the antenna. Thus, a streamlined, full metal chassis capable of meeting the increasing wireless operation demands is needed.

Some information handling systems would address these competing needs by providing for cutout portions of a metal outer chassis cover filled with plastic behind which RF transmitters/receivers would be mounted. The cutouts to accommodate radio frequency (RF) transmitters/receivers are often located in aesthetically undesirable locations and require additional plastic components to cover the cutout, thus not fully meeting the streamlining needs. The plastic components may add a component to be manufactured and can be required to be seamlessly integrated into an otherwise smooth metal chassis cover to achieve a level of aesthetics. Further, the plastic portions included may be expensive to machine, and may require intricate multi-step processes for integrating the metal and plastic parts into a single chassis. This requirement could require difficult and expensive processes to manufacture with a less aesthetically desirable result. Other options include, for aperture type antenna transmitters, creation of an aperture in the metal display panel chassis or base chassis and using the metal chassis as a ground plane for excitation of the aperture.

In addition, in the case of the convertible laptop information handling system, 360-degree configurability may be a feature available to a user during use. Thus, often an antenna such as an aperture antenna system would be located at the top (e.g., A-cover) with a plastic antenna window in a metal chassis cover to radiate in 360-degree mode (such as closed mode), or at the bottom (e.g., C-cover) to radiate in 360-degree mode (such as open mode). Such a configuration could make the display panel housing (e.g., A-cover) or even the base panel housing (e.g., C-cover) thicker, to accommodate antennas and cables behind the plastic panel at the top (or bottom) of either housing. Overall, an addition of a plastic antenna window in an A-cover or C-cover may not meet the streamlining needs. A solution is needed that does not increase the thickness of the metal chassis, and does not require additional components and manufacturing steps such as those associated with installation of extra RF transparent windows to break up the metal chassis in evident locations.

The metal chassis in embodiments described herein may include a hinge operably connecting the A-cover to the D-cover such that the keyboard and touchpad enclosed within the C-cover and attached to the D-cover may be placed in a plurality of configurations with respect to the digital display enclosed within the B-cover and attached to the A-cover. The plurality of configurations may include, but may not be limited to, an open configuration in which the A-cover is oriented at a right or obtuse angle from the D-cover (similar to an open laptop computer) and a closed configuration in which the A-cover lies substantially parallel to the D-cover (similar to a closed laptop computer), or other orientations.

Manufacture of embodiments of the present disclosure may involve fewer extraneous parts than previous chassis by forming the exterior or outer portions of the information handling system, including the bottom portion of the D-cover and the top portion of the A-cover, from metal in some embodiments.

Examples are set forth below with respect to particular aspects of an information handling system including case portions such as for a laptop information handling system including the chassis components designed with a fully metal structure and configurable such that the information handling system may operate in any of several usage mode configurations.

FIG. 1 shows an information handling system 100 capable of administering each of the specific embodiments of the present disclosure. The information handling system 100, in an embodiment, can represent the mobile information handling systems 210, 220, and 230 or servers or systems located anywhere within network 200 described in connection with FIG. 2 herein, including the remote data centers operating virtual machine applications. Information handling system 100 may represent a mobile information handling system associated with a user or recipient of intended wireless communication. A mobile information handling system may execute instructions via a processor such as a microcontroller unit (MCU) operating both firmware instructions or hardwired instructions for the antenna adaptation controller 134 to achieve WLAN or WWAN antenna optimization according to embodiments disclosed herein. The application programs operating on the information handling system 100 may communicate or otherwise operate via concurrent wireless links, individual wireless links, or combinations over any available radio access technology (RAT) protocols including WLAN protocols. These application programs may operate in some example embodiments as software, in whole or in part, on an information handling system while other portions of the software applications may operate on remote server systems. The antenna adaptation controller 134 of the presently disclosed embodiments may operate as firmware or hardwired circuitry or any combination on controllers or processors within the information handling system 100 for interface with components of a wireless interface system 120. It is understood that some aspects of the antenna adaptation controller 134 described herein may interface or operate as software or via other controllers associated with the wireless interface system 120 or elsewhere within information handling system 100.

Information handling system 100 may also represent a networked server or other system from which some software applications are administered or which wireless communications such as across WLAN or WWAN may be conducted. In other aspects, networked servers or systems may operate the antenna adaptation controller 134 for use with a wireless interface system 120 on those devices similar to embodiments for WLAN or WWAN antenna optimization operation according to according to various embodiments.

The information handling system 100 may include a processor 102 such as a central processing unit (CPU), a graphics processing unit (GPU), or both. Moreover, the information handling system 100 can include a main memory 104 and a static memory 106 that can communicate with each other via a bus 108. As shown, the information handling system 100 may further include a video display unit 110, such as a liquid crystal display (LCD), an organic light emitting diode (OLED), a flat panel display, or a solid-state display. Display 110 may include a touch screen display module and touch screen controller (not shown) for receiving user inputs to the information handling system 100. Touch screen display module may detect touch or proximity to a display screen by detecting capacitance changes in the display screen. Additionally, the information handling system 100 may include an input device 112, such as a keyboard, and a cursor control device, such as a mouse or touchpad or similar peripheral input device. The information handling system may include a power source such as battery 114 or an A/C power source. The information handling system 100 can also include a disk drive unit 116, and a signal generation device 118, such as a speaker or remote control. The information handling system 100 can include a network interface device such as a wireless adapter 120. The information handling system 100 can also represent a server device whose resources can be shared by multiple client devices, or it can represent an individual client device, such as a desktop personal computer, a laptop computer, a tablet computer, a wearable computing device, or a mobile smart phone.

The information handling system 100 can include sets of instructions 124 that can be executed to cause the computer system to perform any one or more desired operations. In many aspects, sets of instructions 124 may implement wireless communications via one or more antenna systems 132 available on information handling system 100. In embodiments presented herein, the sets of instructions 124 may implement wireless communications via one or more antenna systems 132 formed within a C-cover or a D-Cover of a laptop-type information handling system. Operation of WLAN and WWAN wireless communications may be enhanced or otherwise improved via WLAN or WWAN antenna operation adjustments via the methods or controller-based functions relating to the antenna adaptation controller 134 disclosed herein. For example, instructions or a controller may execute software or firmware applications or algorithms which utilize one or more wireless links for wireless communications via the wireless interface system as well as other aspects or components. The antenna adaptation controller 134 may execute instructions as disclosed herein for monitoring wireless link state information, information handling system configuration data, or other input data to generate channel estimation and determine antenna radiation patterns. In the embodiments presented herein, the antenna adaptation controller 134 may execute instructions as disclosed herein to transmit a communications signal from an antenna system that is excited to resonant a target frequency at a slot formed in the D-Cover to transmit an electromagnetic wave at the target frequency or harmonics thereof. The term "antenna system" described herein is meant to be understood as any object that emits a RF electromagnetic (EM) wave therefrom.

In the embodiments presented herein, the antenna adaptation controller 134 may execute instructions as disclosed herein to adjust, via a parasitic coupling element, change the directionality and/or pattern of the emitted RF signals from the antenna. In various embodiments of the disclosure the parasitic coupling element includes a reflector network.

The antenna adaptation controller 134 may implement adjustments to wireless antenna systems and resources via an antenna front end 125 and WLAN or WWAN radio module systems within the wireless interface system 120. The antenna adaptation controller 134, in an embodiment, may implement adjustments to wireless antenna systems that operate on frequencies related to those 5G networks (i.e., high frequency (HF) band, very high frequency (VHF) band, ultra-high frequency (VHF) band, L band, S band, C band, X band, Ku band, K band, Ka band, V band, W band, and millimeter wave bands). Aspects of the antenna optimization for the antenna adaptation controller 134 may be included as part of an antenna front end 125 in some aspects or may be included with other aspects of the wireless interface system 120 such as WLAN radio module such as part of the radio frequency (RF) subsystems 130. The antenna adaptation controller 134 described in the present disclosure and operating as firmware or hardware (or in some parts software) may remedy or adjust one or more of a plurality of antenna systems 132 via selecting power adjustments and adjustments to an antenna adaptation network to modify antenna radiation patterns emitted by an antenna element and any parasitic coupling element in various embodiments.

Multiple WLAN or WWAN antenna systems may operate on various communication frequency bands such as under IEEE 802.11a and IEEE 802.11g (i.e., medium frequency (MF) band, high frequency (HF) band, very high frequency (VHF) band, ultra-high frequency (VHF) band, L band, S band, C band, X band, $K_u$ band, K band, $K_a$ band, V band, W band, and millimeter wave bands) providing multiple band options for frequency channels. In some embodiments, the antenna systems may operate as 5G networks that implement relatively higher data transfer wavelengths such as high frequency (HF) band, very high frequency (VHF) band, ultra-high frequency (VHF) band, L band, S band, C band, X band, Ku band, K band, Ka band, V band, W band, and millimeter wave bands. Further antenna radiation patterns and selection of antenna options or power levels may be adapted due physical proximity of other antenna systems, of a user with potential SAR exposure, or improvement of RF channel operation according to received signal strength indicator (RSSI), signal to noise ratio (SNR), bit error rate (BER), modulation and coding scheme index values (MCS), or data throughput indications among other factors. In some aspects WWAN or WLAN antenna adaptation controller may execute firmware algorithms or hardware to regulate operation of the one or more antenna systems 132 such as WWAN or WLAN antennas in the information handling system 100 to avoid poor wireless link performance due to poor reception, poor MCS levels of data bandwidth available, or poor indication of throughput due to indications of low RSSI, low power levels available (such as due to SAR), inefficient radiation patterns among other potential effects on wireless link channels used.

Various software modules comprising software instructions 124 or firmware instructions may be coordinated by an operating system (OS) and via an application programming interface (API). An example operating system may include Windows®, Android®, and other OS types known in the art. Example APIs may include Win 32®, Core Java® API, Android® APIs, or wireless adapter driver API. In a further example, processor 102 may conduct processing of mobile information handling system applications by the information handling system 100 according to the systems and methods disclosed herein which may utilize wireless communications. The computer system 100 may operate as a standalone device or may be connected such as using a network, to other computer systems or peripheral devices. In other aspects, additional processor or control logic may be implemented in graphical processor units (GPUs) or controllers located with radio modules or within a wireless adapter 120 to implement method embodiments of the antenna adaptation controller and antenna optimization according to embodiments herein. Code instructions 124 in firmware, hardware or some combination may be executed to implement operations of the antenna adaptation controller and antenna optimization on control logic or processor systems within the wireless adapter 120 for example.

In a networked deployment, the information handling system 100 may operate in the capacity of a server or as a client user computer in a server-client user network environment, or as a peer computer system in a peer-to-peer (or distributed) network environment. The information handling system 100 can also be implemented as or incorporated into various devices, such as a personal computer (PC), a tablet PC, a set-top box (STB), a PDA, a mobile information handling system, a tablet computer, a laptop computer, a desktop computer, a communications device, a wireless smart phone, wearable computing devices, a control system, a camera, a scanner, a printer, a personal trusted device, a web appliance, a network router, switch or bridge, or any other machine capable of executing a set of instructions (sequential or otherwise) that specify actions to be taken by that machine. In a particular embodiment, the computer system 100 can be implemented using electronic devices that provide voice, video or data communication. Further, while a single information handling system 100 is illustrated, the term "system" shall also be taken to include any collection of systems or sub-systems that individually or jointly execute a set, or multiple sets, of instructions to perform one or more computer functions.

The disk drive unit 116 may include a computer-readable medium 122 in which one or more sets of instructions 124 such as software can be embedded. Similarly, main memory 104 and static memory 106 may also contain computer-readable medium for storage of one or more sets of instructions 124. The disk drive unit 116 and static memory 106 also contain space for data storage. Some memory or storage may reside in the wireless adapter 120. Further, the instructions 124 may embody one or more of the methods or logic as described herein. For example, instructions relating to the WWAN or WLAN antenna adaptation system or antenna adjustments described in embodiments herein may be stored here or transmitted to local memory located with the antenna adaptation controller 134, antenna front end 125, or wireless module in RF subsystem 130 in the wireless interface system 120.

In a particular embodiment, the instructions 124 may reside completely, or at least partially, within a memory, such as non-volatile static memory, during execution of antenna adaptation by the antenna adaptation controller 134 in wireless interface system 132 of information handling system 100. As explained, some or all of the WWAN or WLAN antenna adaptation and antenna optimization may be executed locally at the antenna adaptation controller 134, antenna front end 125, or wireless module subsystem 130. Some aspects may operate remotely among those portions of the wireless interface system or with the main memory 104 and the processor 102 in parts including the computer-readable media in some embodiments.

Battery 114 may be operatively coupled to a power management unit that tracks and provides power state data 126. This power state data 126 may be stored with the instructions 124 to be used with the systems and methods disclosed herein in determining WWAN or WLAN antenna adaptation and antenna optimization in some embodiments.

The network interface device shown as wireless adapter 120 can provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. Wireless adapter 120 may include one or more RF subsystems 130 with transmitter/receiver circuitry, modem circuitry, one or more unified antenna front end circuits 125, one or more wireless controller circuits such as antenna adaptation controller 134, amplifiers, antenna systems 132 and other radio frequency (RF) subsystem circuitry 130 for wireless communications via multiple radio access technologies. Each RF subsystem 130 may communicate with one or more wireless technology protocols. The RF subsystem 130 may contain individual subscriber identity module (SIM) profiles for each technology service provider and their available protocols for subscriber-based radio access technologies such as cellular LTE communications. The wireless adapter 120 may also include antenna systems 132 which may be tunable antenna systems or may include an antenna adaptation network for use with the system and methods disclosed herein to optimize antenna system operation. Additional antenna system adaptation network circuitry (not shown) may also be included with the wireless interface system 120 to implement WLAN or WWAN modification measures as described in various embodiments of the present disclosure.

In some aspects of the present disclosure, a wireless adapter 120 may operate two or more wireless links. In a further aspect, the wireless adapter 120 may operate the two or more wireless links with a single, shared communication frequency band such as with the Wi-Fi WLAN operation or 5G LTE standard WWAN operations in an example aspect. For example, a 5 GHz wireless communication frequency band may be apportioned under the 5G standards for communication on either small-cell WWAN wireless link operation or Wi-Fi WLAN operation as well as other wireless activity in LTE, WiFi, WiGig, Bluetooth, or other communication protocols. In some embodiments, the shared, wireless communication bands may be transmitted through one or a plurality of antennas. Other communication frequency bands are contemplated for use with the embodiments of the present disclosure as well.

In other aspects, the information handling system 100 operating as a mobile information handling system may operate a plurality of wireless adapters 120 for concurrent radio operation in one or more wireless communication bands. The plurality of wireless adapters 120 may further operate in nearby wireless communication bands in some disclosed embodiments. Further, harmonics, environmental wireless conditions, and other effects may impact wireless link operation when a plurality of wireless links are operating as in some of the presently described embodiments. The series of potential effects on wireless link operation may cause an assessment of the wireless adapters 120 to potentially make antenna system adjustments according to the WWAN or WLAN antenna adaptation control system of the present disclosure.

The wireless adapter 120 may operate in accordance with any wireless data communication standards. To communicate with a wireless local area network, standards including Institute of Electrical and Electronics Engineers (IEEE) 802.11 wireless local area network (WLAN) standards, IEEE 802.15 wireless personal area network (WPAN) standards, wireless wide area network (WWAN) such as $3^{rd}$ Generation Partnership Project (3GPP) or $3^{rd}$ Generation Partnership Project 2 (3GPP2), or similar wireless standards may be used. Wireless adapter 120 and antenna adaptation controller 134 may connect to any combination of macro-cellular wireless connections including $2^{nd}$ Generation (2G), $2.5^{th}$ Generation (2.5G), $3^{rd}$ Generation (3G), $4^{th}$ Generation (4G), $5^{th}$ Generation (5G) or the like from one or more service providers. Utilization of RF communication bands according to several example embodiments of the present disclosure may include bands used with the WLAN standards and WWAN carriers which may operate in both license and unlicensed spectrums. For example, both WLAN and WWAN may use the Unlicensed National Information Infrastructure (U-NII) band which typically operates in the ~5 MHz frequency band, such as 802.11 a/h/j/n/ac (e.g., having center frequencies between 5.170-5.785 GHz). It is understood that any number of available channels may be available under the 5 GHz shared communication frequency band in example embodiments. WLAN, for example, may also operate at a 2.4 GHz band. WWAN may operate in a number of bands, some of which are propriety but may include a wireless communication frequency band at approximately 2.5 GHz band for example. In additional examples, WWAN carrier licensed bands may operate at frequency bands of approximately 700 MHz, 800 MHz, 1900 MHz, or 1700/2100 MHz for example as well. In the example embodiment, mobile information handling system 100 includes both unlicensed wireless RF communication capabilities as well as licensed wireless RF communication capabilities. For example, licensed wireless RF communication capabilities may be available via a subscriber carrier wireless service. With the licensed wireless RF communication capability, WWAN RF front end may operate on a licensed WWAN wireless radio with authorization for subscriber access to a wireless service provider on a carrier licensed frequency band. With the advent of 5G networks, any number of protocols may be implemented including global system for mobile communications (GSM) protocols, general packet radio service (GPRS) protocols, enhanced data rates for GSM evolution (EDGE) protocols, code-division multiple access (CDMA) protocols, universal mobile telecommunications system (UMTS) protocols, long term evolution (LTE) protocols, long term evolution advanced (LTE-A) protocols, WiMAX, LTE, and LTE Advanced, LTE-LAA, small cell WWAN and IP multimedia core network subsystem (IMS) protocols, for example, and any other communications protocols suitable for the method(s), system(s) and device(s) described herein, including any proprietary protocols.

The wireless adapter 120 can represent an add-in card, wireless network interface module that is integrated with a main board of the information handling system or integrated with another wireless network interface capability, or any combination thereof. In an embodiment the wireless adapter 120 may include one or more RF subsystems 130 including transmitters and wireless controllers such as wireless module subsystems for connecting via a multitude of wireless links under a variety of protocols. In an example embodiment, an information handling system may have an antenna system transmitter 132 for 5G small cell WWAN, Wi-Fi WLAN or WiGig connectivity and one or more additional antenna system transmitters 132 for macro-cellular communication. The RF subsystems 130 include wireless controllers to manage authentication, connectivity, communications, power levels for transmission, buffering, error correction, baseband processing, and other functions of the wireless adapter 120.

The RF subsystems 130 of the wireless adapters may also measure various metrics relating to wireless communication pursuant to operation of an antenna system as in the present disclosure. For example, the wireless controller of a RF subsystem 130 may manage detecting and measuring received signal strength levels, bit error rates, signal to noise ratios, latencies, power delay profile, delay spread, and other metrics relating to signal quality and strength. Such detected and measured aspects of wireless links, such as WWAN or WLAN links operating on one or more antenna systems 132, may be used by the antenna adaptation controller to adapt the antenna systems 132 according to an antenna adaptation network according to various embodiments herein. In one embodiment, a wireless controller of a wireless interface system 120 may manage one or more RF subsystems 130. The wireless controller also manages transmission power levels which directly affect RF subsystem power consumption as well as transmission power levels from the plurality of antenna systems 132. The transmission power levels from the antenna systems 132 may be relevant to specific absorption rate (SAR) safety limitations for transmitting mobile information handling systems. To control and measure power consumption via a RF subsystem 130, the RF subsystem 130 may control and measure current and voltage power that is directed to operate one or more antenna systems 132.

The wireless network may have a wireless mesh architecture in accordance with mesh networks described by the wireless data communications standards or similar standards in some embodiments but not necessarily in all embodiments. The wireless adapter 120 may also connect to the external network via a WPAN, WLAN, WWAN or similar wireless switched Ethernet connection. The wireless data communication standards set forth protocols for communications and routing via access points, as well as protocols for a variety of other operations. Other operations may include handoff of client devices moving between nodes, self-organizing of routing operations, or self-healing architectures in case of interruption.

In some embodiments, software, firmware, dedicated hardware implementations such as application specific integrated circuits, programmable logic arrays and other hardware devices can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations can include distributed processing, component/object distributed processing, and parallel processing. Alternatively, virtual computer system processing can be constructed to implement one or more of the methods or functionalities as described herein.

The present disclosure contemplates a computer-readable medium that includes instructions 124 or receives and executes instructions 124 responsive to a propagated signal; so that a device connected to a network 128 can communicate voice, video or data over the network 128. Further, the instructions 124 may be transmitted or received over the network 128 via the network interface device or wireless adapter 120.

Information handling system 100 includes one or more application programs, and Basic Input/Output System and firmware (BIOS/FW) code. BIOS/FW code functions to initialize information handling system 100 on power up, to launch an operating system, and to manage input and output interactions between the operating system and the other elements of information handling system 100. In a particular embodiment, BIOS/FW code resides in memory 104, and include machine-executable code that is executed by processor 102 to perform various functions of information handling system 100. In another embodiment (not illustrated), application programs and BIOS/FW code may reside in another storage medium of information handling system 100. For example, application programs and BIOS/FW code can reside in drive 116, in a ROM (not illustrated) associated with information handling system 100, in an option-ROM (not illustrated) associated with various devices of information handling system 100, in storage system 107, in a storage system (not illustrated) associated with network channel of a wireless adapter 120, in another storage medium of information handling system 100, or a combination thereof. Application programs 124 and BIOS/FW code 124 can each be implemented as single programs, or as separate programs carrying out the various features as described herein.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories. Further, the computer-readable medium can be a random-access memory or other volatile re-writable memory. Additionally, the computer-readable medium can include a magneto-optical or optical medium, such as a disk or tapes or other storage device to store information received via carrier wave signals such as a signal communicated over a transmission medium. Furthermore, a computer readable medium can store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Figure 2:
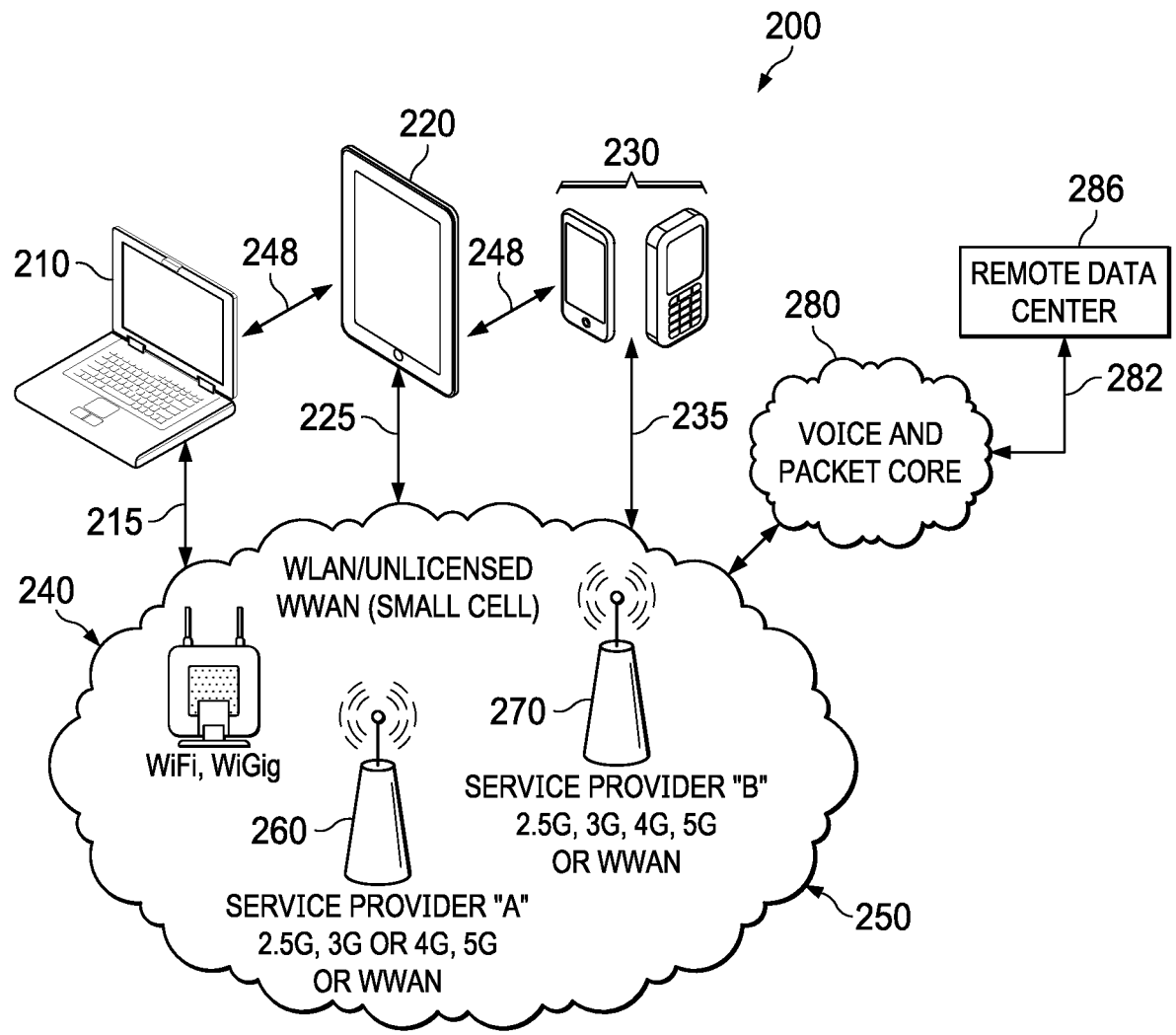
FIG. 2 shows a block diagram of a network environment offering several communication protocol options and mobile information handling systems according to an embodiment of the present disclosure.

FIG. 2 shows a network 200 that can include one or more information handling systems 210, 220, 230. In a particular embodiment, network 200 includes networked mobile information handling systems 210, 220, and 230, wireless network access points, and multiple wireless connection link options. A variety of additional computing resources of network 200 may include client mobile information handling systems, data processing servers, network storage devices, local and wide area networks, or other resources as needed or desired. As partially depicted, systems 210, 220, and 230 may be a laptop computer, tablet computer, 360-degree convertible systems, wearable computing devices, or a smart phone device. These mobile information handling systems 210, 220, and 230, may access a wireless local network 240, or they may access a macro-cellular network 250. For example, the wireless local network 240 may be the wireless local area network (WLAN), a wireless personal area network (WPAN), or a wireless wide area network (WWAN). In an example embodiment, LTE-LAA WWAN may operate with a small-cell WWAN wireless access point option.

Since WPAN or Wi-Fi Direct Connection 248 and WWAN networks can functionally operate similar to WLANs, they may be considered as wireless local area networks (WLANs) for purposes herein. Components of a WLAN may be connected by wireline or Ethernet connections to a wider external network. For example, wireless network access points may be connected to a wireless network controller and an Ethernet switch. Wireless communications across wireless local network 240 may be via standard protocols such as IEEE 802.11 Wi-Fi, IEEE 802.11ad WiGig, IEEE 802.15 WPAN, IEEE 802.11, IEEE 1914/1904, IEEE P2413/1471/42010, or 5G small cell WWAN communications such as eNodeB, or similar wireless network protocols. Alternatively, other available wireless links within network 200 may include macro-cellular connections 250 via one or more service providers 260 and 270. Service provider macro-cellular connections may include 2G standards such as GSM, 2.5G standards such as GSM EDGE and GPRS, 3G standards such as W-CDMA/UMTS and CDMA 2000, 4G standards, or 5G standards including GSM, GPRS, EDGE, UMTS, IMS, WiMAX, LTE, and LTE Advanced, LTE-LAA, small cell WWAN, and the like.

Wireless local network 240 and macro-cellular network 250 may include a variety of licensed, unlicensed or shared communication frequency bands as well as a variety of wireless protocol technologies ranging from those operating in macrocells, small cells, picocells, or femtocells.

In some embodiments according to the present disclosure, a networked mobile information handling system 210, 220, or 230 may have a plurality of wireless network interface systems capable of transmitting simultaneously within a shared communication frequency band. That communication within a shared communication frequency band may be sourced from different protocols on parallel wireless network interface systems or from a single wireless network interface system capable of transmitting and receiving from multiple protocols. Similarly, a single antenna or plural antennas may be used on each of the wireless communication devices. Example competing protocols may be local wireless network access protocols such as Wi-Fi/WLAN, WiGig, and small cell WWAN in an unlicensed, shared communication frequency band. Example communication frequency bands may include unlicensed 5 GHz frequency bands or 3.5 GHz conditional shared communication frequency bands under FCC Part 96. Wi-Fi ISM frequency bands that may be subject to sharing include 2.4 GHz, 60 GHz, 900 MHz or similar bands as understood by those of skill in the art. Within local portion of wireless network 250 access points for Wi-Fi or WiGig as well as small cell WWAN connectivity may be available in emerging 5G technology such as high frequency (HF) band, very high frequency (VHF) band, ultra-high frequency (VHF) band, L band, S band, C band, X band, Ku band, K band, Ka band, V band, W band, and millimeter wave bands. This may create situations where a plurality of antenna systems are operating on a mobile information handling system 210, 220 or 230 via concurrent communication wireless links on both WLAN and WWAN and which may operate within the same, adjacent, or otherwise interfering communication frequency bands. The antenna may be a transmitting antenna that includes high-band, medium-band, low-band, and unlicensed band transmitting antennas. Alternatively, embodiments may include a single transceiving antennas capable of receiving and transmitting, and/or more than one transceiving antennas. Each of the antennas included in the information handling system 100 in an embodiment may be subject to the FCC regulations on specific absorption rate (SAR). The antenna in the embodiments described herein is an aperture antenna (i.e., a cavity-backed dynamic tunable aperture antenna system) intended for efficient use of space within a metal chassis of an information handling system. Aperture antennas in embodiments of the present disclosure may be an effective improvement on wireless antennas employed in previous information handling systems.

The voice and packet core network 280 may contain externally accessible computing resources and connect to a remote data center 286. The voice and packet core network 280 may contain multiple intermediate web servers or other locations with accessible data (not shown). The voice and packet core network 280 may also connect to other wireless networks similar to 240 or 250 and additional mobile information handling systems such as 210, 220, 230 or similar connected to those additional wireless networks. Connection 282 between the wireless network 240 and remote data center 286 or connection to other additional wireless networks may be via Ethernet or another similar connection to the world-wide-web, a WAN, a LAN, another WLAN, or other network structure. Such a connection 282 may be made via a WLAN access point/Ethernet switch to the external network and be a backhaul connection. The access point may be connected to one or more wireless access points in the WLAN before connecting directly to a mobile information handling system or may connect directly to one or more mobile information handling systems 210, 220, and 230. Alternatively, mobile information handling systems 210, 220, and 230 may connect to the external network via base station locations at service providers such as 260 and 270. These service provider locations may be network connected via backhaul connectivity through the voice and packet core network 280.

Remote data centers may include web servers or resources within a cloud environment that operate via the voice and packet core 280 or other wider internet connectivity. For example, remote data centers can include additional information handling systems, data processing servers, network storage devices, local and wide area networks, or other resources as needed or desired. Having such remote capabilities may permit fewer resources to be maintained at the mobile information handling systems 210, 220, and 230 allowing streamlining and efficiency within those devices. Similarly, remote data center permits fewer resources to be maintained in other parts of network 200.

Although 215, 225, and 235 are shown connecting wireless adapters of mobile information handling systems 210, 220, and 230 to wireless networks 240 or 250, a variety of wireless links are contemplated. Wireless communication may link through a wireless access point (Wi-Fi or WiGig), through unlicensed WWAN small cell base stations such as in network 240 or through a service provider tower such as that shown with service provider A 260 or service provider B 270 and in network 250. In other aspects, mobile information handling systems 210, 220, and 230 may communicate intra-device via 248 when one or more of the mobile information handling systems 210, 220, and 230 are set to act as an access point or even potentially a WWAN connection via small cell communication on licensed or unlicensed WWAN connections. For example, one of mobile information handling systems 210, 220, and 230 may serve as a Wi-Fi hotspot in an embodiment. Concurrent wireless links to information handling systems 210, 220, and 230 may be connected via any access points including other mobile information handling systems as illustrated in FIG. 2.

Figure 3:
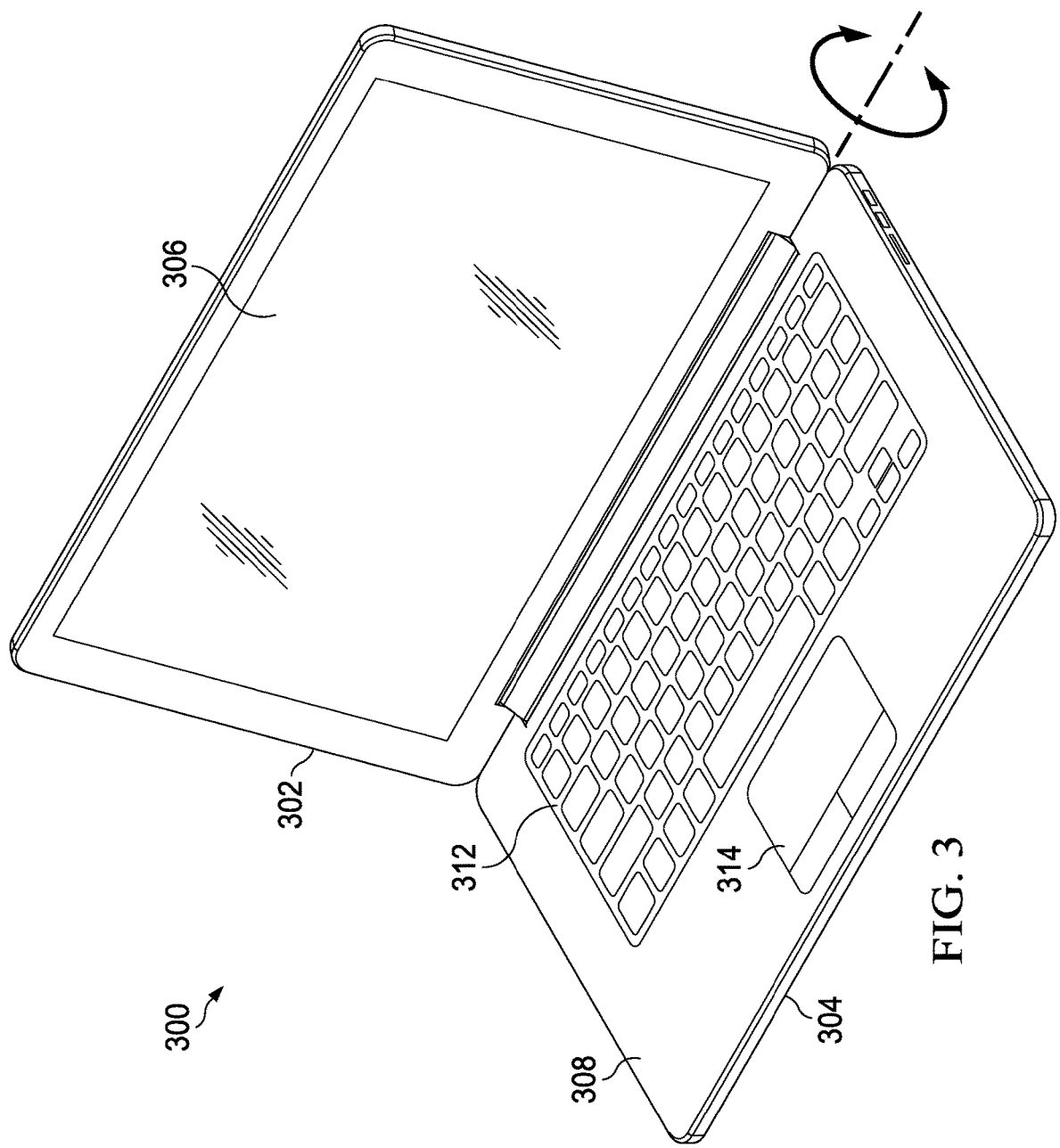
FIG. 3 shows a graphical illustration of an information handling system placed in an open configuration according to an embodiment of the present disclosure.

FIG. 3 shows a graphical illustration of an information handling system 300. In certain embodiments, portions of the information handling system include a metal chassis including a base chassis and display chassis placed in an open configuration according to an embodiment of the present disclosure. In certain embodiments, the display chassis may include an A-cover 302. In certain embodiments, the base chassis may include a D-cover 304. In certain embodiments, the display chassis may include a B-cover 306. In certain embodiments, the base chassis may include a C-cover 308. The open configuration is shown for illustration purposes. It is understood that a closed configuration would have the display chassis fully closed onto the base chassis.

The metal chassis in an embodiment may comprise an outer metal case or shell of an information handling system such as a tablet device, laptop, or other mobile information handling system. As shown in FIG. 3, the metal chassis 300, in an embodiment, may further include a plurality of chassis or cases. For example, the metal chassis 300 may further include an A-cover 302 functioning to enclose a portion of the information handling system. As another example, the metal chassis 300, in an embodiment, may further include a D-cover 304 functioning to enclose another portion of the information handling system along with a C-cover 308 which may include a transmitting/receiving antenna according to the embodiments described herein. The C-cover 308 may include, for example, a keyboard 312, a trackpad 314, or other input/output (I/O) device. When placed in the closed configuration, the A-cover 302 forms a top outer protective shell, or a portion of a lid for the information handling system, while the D-cover 304 forms a bottom outer protective shell, or a portion of a base. When in the fully closed configuration, the A-cover 302 and the D-cover 304 would be substantially parallel to one another.

In some embodiments, both the A-cover 302 and the D-cover 304 may be comprised entirely of metal. In some embodiments, the A-cover 302 and D-cover 304 may include both metallic and plastic components. For example, plastic components that are radio-frequency (RF) transparent may be used to form a portion of the C-cover 308.

In various embodiments, the display chasses may be movable connected to the base chassis via one or more hinges. In an embodiment, the A-cover 302 may be movably connected to a back edge of the D-cover 304 via one or more hinges. In this configuration the hinges allow the A-cover 302 to rotate from and to the D-cover 304 allowing for multiple orientations of the information handling system as described herein. In an embodiment, the information handling system may include a sensor to detect the orientation of the information handling system and activate or deactivate any of a number of antenna systems based on the occurrence of any specific orientation. In an embodiment, the information handling system may include a sensor to detect the orientation of the information handling system and activate or deactivate an integrated closed mode switch mechanism based on the occurrence of any specific orientation. In some embodiments, the information handling system may be a laptop with limited rotation of the A-cover 304 with regard to the D-cover 304, for example up to 180°. In other embodiments the information handling system may be a convertible information handling system with full rotation to a tablet configuration.

FIG. 4 shows a block diagram of an integrated closed mode switch mechanism information handling system environment 400 according to an embodiment of the present disclosure. More specifically in various embodiments, the integrated closed mode switch mechanism information handling system environment 400 includes one or more of an integrated sensor hub (ISH) 410, an embedded controller (EC) 412, a basic input output system (BIOS) 414, a power table circuit 416 and a wireless module 418. In various embodiments, some or all of ISH 410, embedded controller (EC) 412, basic input output system (BIOS) 414, power table circuit 416 and wireless module 418 function as an antenna controller.

In various embodiments, the integrated closed mode switch mechanism information handling system environment 400 also includes one or both of a primary antenna closed mode switch system 420 and an auxiliary antenna closed mode switch system 430. In various embodiments, the integrated closed mode switch mechanism information handling system environment 400 also includes one or both of a primary antenna 450 and an auxiliary antenna 452.

In various embodiments, the integrated sensor hub 410 collects various sensor data that is then provided to the embedded controller 412. The embedded controller 412 identifies a user mode (e.g., open vs. closed) based on the sensor data, triggers a corresponding power table from the power table circuit 416 and causes one or both the primary antenna closed mode switch system 420 and the auxiliary antenna closed mode switch system 430 to adopt a corresponding matching circuit. In various embodiments, the wireless module 418 transmits a wireless signal based on the corresponding power table from the power table circuit 416.

In various embodiments, the primary antenna closed mode switch system 420 includes an open mode electrical component portion 422, a closed mode electrical component portion 424, a switch 426 and a radiating component 428. In various embodiments, the open mode electrical component portion 422 and the closed mode electrical component portion 424 function as tuning circuits for the primary antenna 450 so that the primary antenna is impedance matched when the information handling system is configured in either an open mode of operation or a closed mode of operation.

In various embodiments, the open mode electrical component portion 422 includes a plurality of open mode electrical components. In various embodiments, the closed mode electrical component portion 422 includes a plurality of closed mode electrical components. In various embodiments, the open mode electrical component portion 422 includes one or more of an inductor L1, a capacitor C1 and a capacitor C2. In various embodiments, the closed mode electrical component portion 424 includes one or more of an inductor L2, a capacitor C3 and a capacitor C4. In various embodiments, the switch 426 includes a single pole double throw (SPDT) type switch. In various embodiments, the switch 426 is controlled to couple one of the open mode electrical component portion and the closed mode electrical component portion from the embedded controller 412 to the radiating component 428. In various embodiments, the values of inductor L1, capacitor C1 and capacitor C2 are selected to tune the primary antenna 450 in an opened mode of operation. In various embodiments, the values of inductor L2, capacitor C3 and capacitor C4 are selected to tune the primary antenna 450 in a closed mode of operation. In various embodiments, at least one of the plurality of open mode electrical components has a different value than at least one of the plurality of closed mode electrical components.

In various embodiments, the auxiliary antenna closed mode switch system 430 includes an auxiliary open mode electrical component portion 432, an auxiliary closed mode electrical component portion 434, a switch 436 and a radiating component 438. In various embodiments, the open mode electrical component portion 432 and the closed mode electrical component portion 434 function as tuning circuits for the auxiliary antenna 452 so that the auxiliary antenna is impedance matched when the information handling system is configured in either an open mode of operation or a closed mode of operation.

In various embodiments, the auxiliary open mode electrical component portion 432 includes a plurality of open mode electrical components. In various embodiments, the auxiliary closed mode electrical component portion 434 includes a plurality of closed mode electrical components. In various embodiments, the open mode electrical component portion 432 includes one or more of an inductor L3, a capacitor C5 and a capacitor C6. In various embodiments, the closed mode electrical component portion 434 includes one or more of an inductor L4, a capacitor C7 and a capacitor C8. In various embodiments, the switch 436 includes a single pole double throw (SPDT) type switch. In various embodiments, the switch 436 is controlled to couple one of the open mode electrical component portion 432 and the closed mode electrical component portion 434 from the embedded controller 412 to the radiating component 438. In various embodiments, the values of inductor L3, capacitor C5 and capacitor C6 are selected to tune the auxiliary antenna 452 in an opened mode of operation. In various embodiments, the values of inductor L4, capacitor C7 and capacitor C8 are selected to tune the auxiliary antenna 452 in a closed mode of operation. In various embodiments, at least one of the plurality of auxiliary open mode electrical components has a different value than at least one of the plurality of auxiliary closed mode electrical components. In certain embodiments, switch 426 and switch 436 are configured from a double pole double throw (DPDT) switch.

FIGS. 5A and 5B show diagrammatic views of an information handling system wireless performance in an open mode of operation and a closed mode of operation, respectively.

Figure 6A:
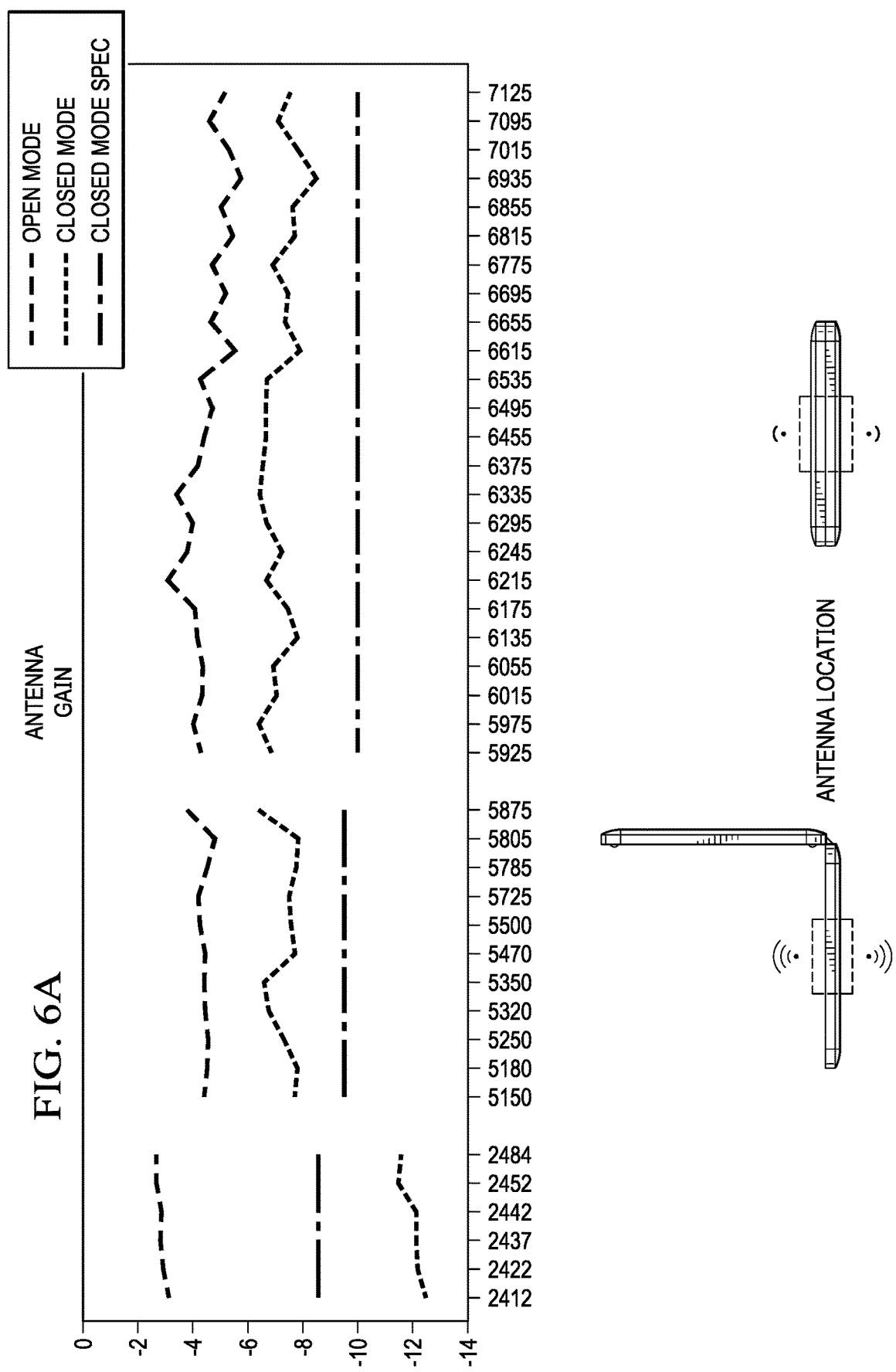
FIGS. 6A and 6B show examples of antenna performance in an open mode of operation and a closed mode of operation according to an embodiment of the present disclosure.
Figure 6B:
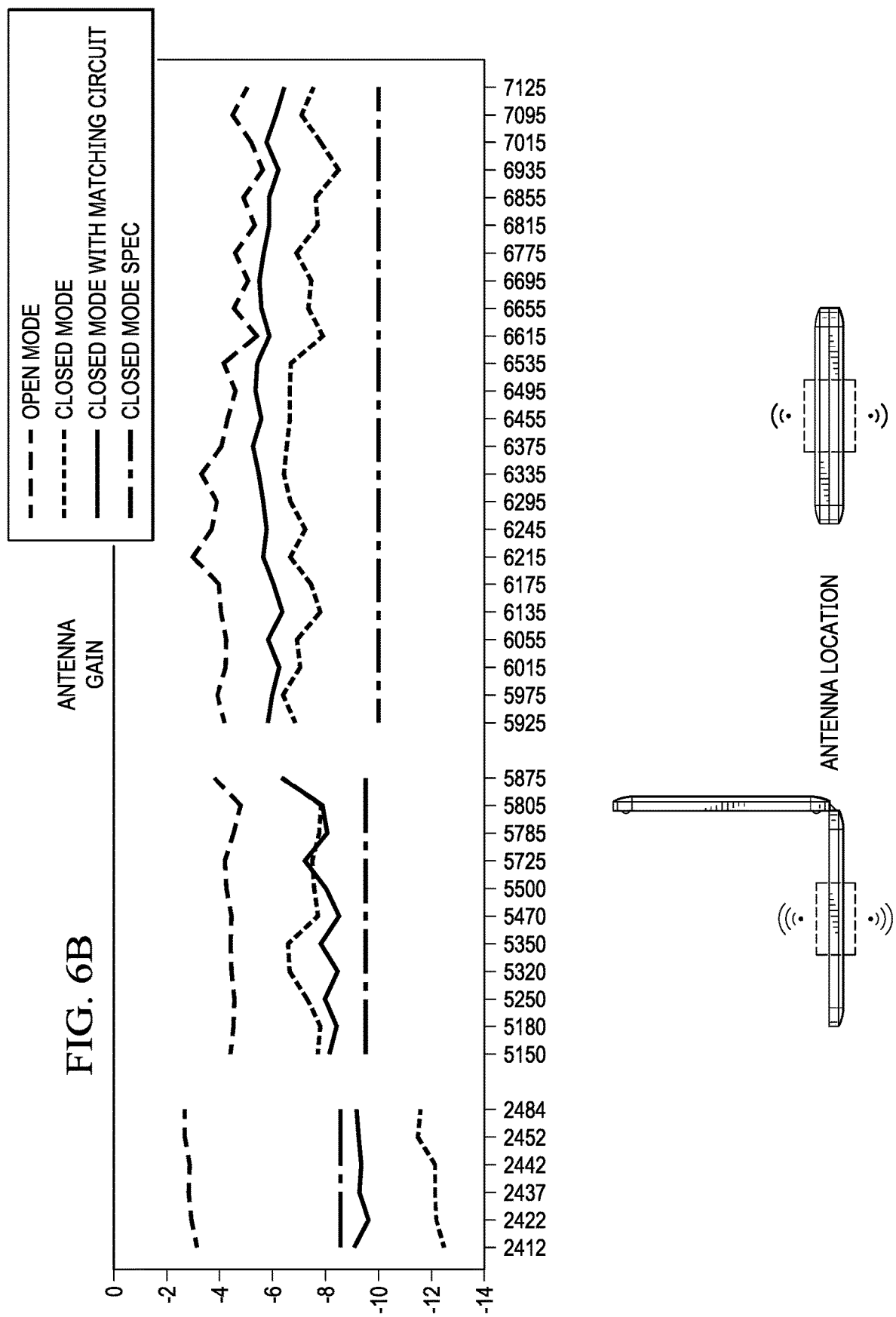

FIGS. 6A and 6B show examples of antenna performance in an open mode of operation and a closed mode of operation according to an embodiment of the present disclosure. Specifically, FIG. 6A shows antenna gain performance for a known information handling system and FIG. 6B shows antenna gain performance for an information handling system which includes integrated closed mode switch mechanism in accordance with the present disclosure.

Figure 7B:
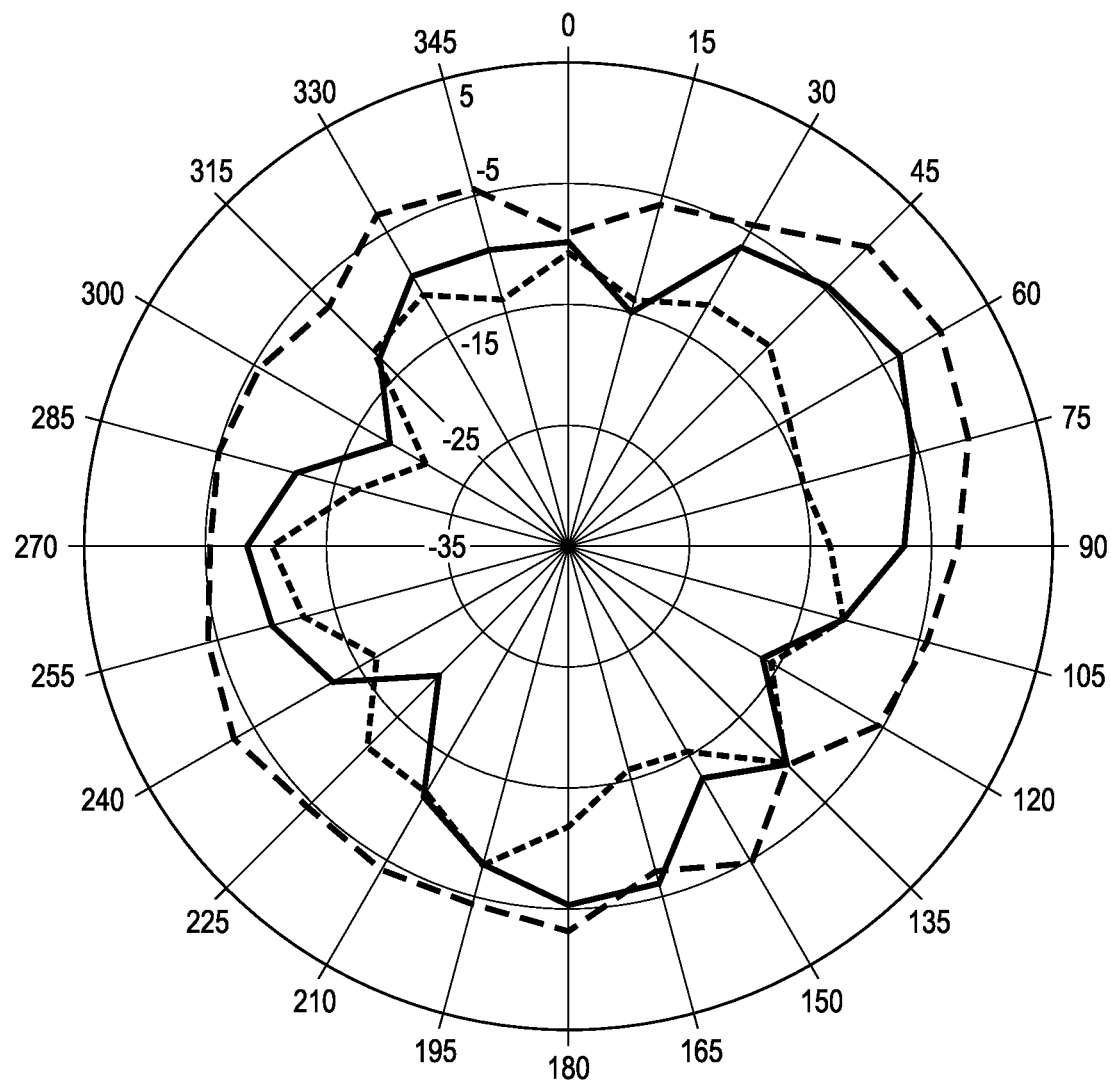

FIGS. 7A and 7B show examples of antenna performance in an open mode of operation and a closed mode of operation according to an embodiment of the present disclosure. Specifically, FIG. 7A shows directional antenna performance along an X Y axis for a known information handling system and FIG. 7B shows directional antenna performance an X Y axis for an information handling system which includes integrated closed mode switch mechanism in accordance with the present disclosure.

Figure 8B:
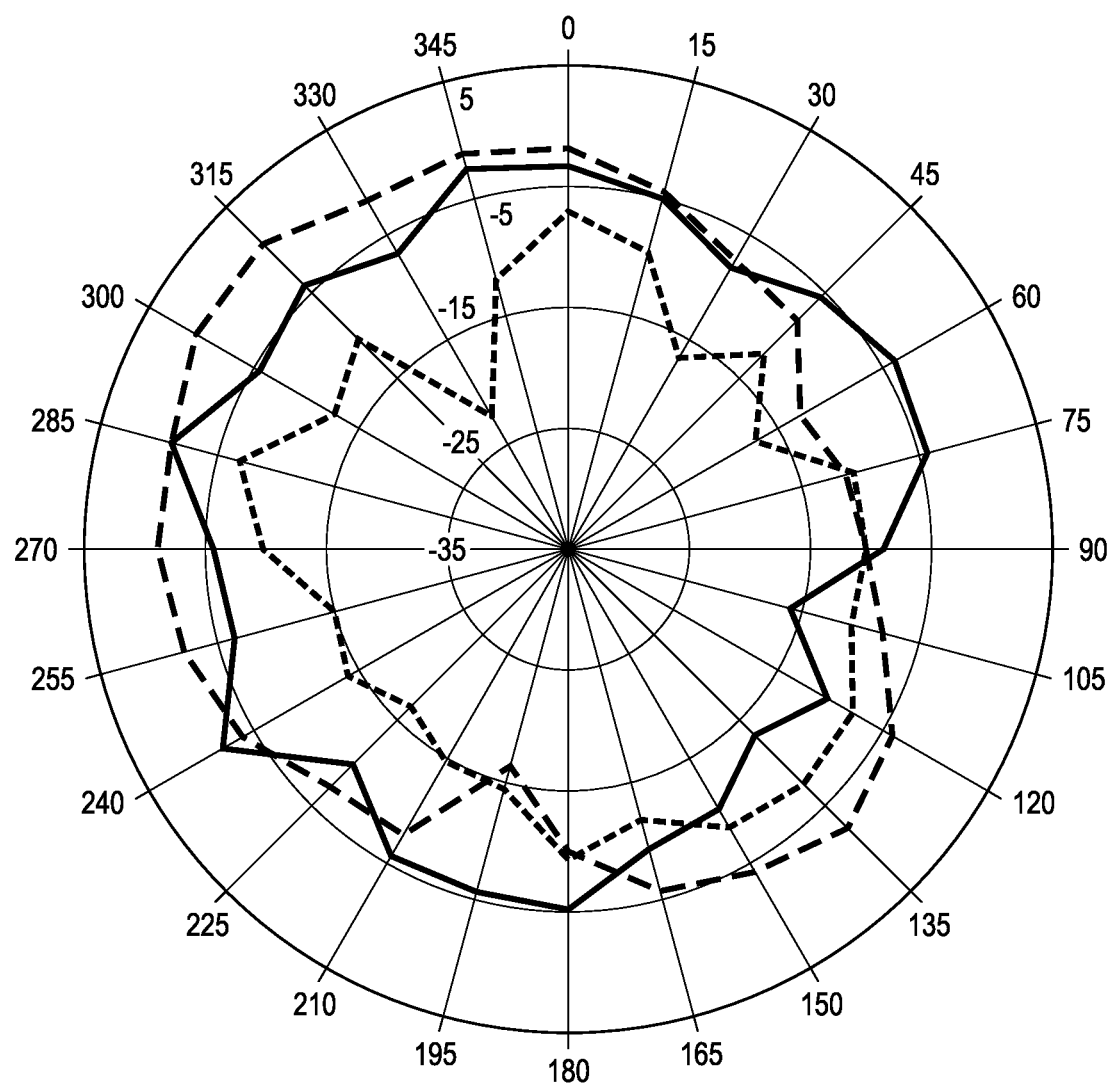

FIGS. 8A and 8B show examples of antenna performance in an open mode of operation and a closed mode of operation according to an embodiment of the present disclosure. Specifically, FIG. 8A shows directional antenna performance along an X Z axis for a known information handling system and FIG. 8B shows directional antenna performance an X Z axis for an information handling system which includes integrated closed mode switch mechanism in accordance with the present disclosure.

Figure 9A:
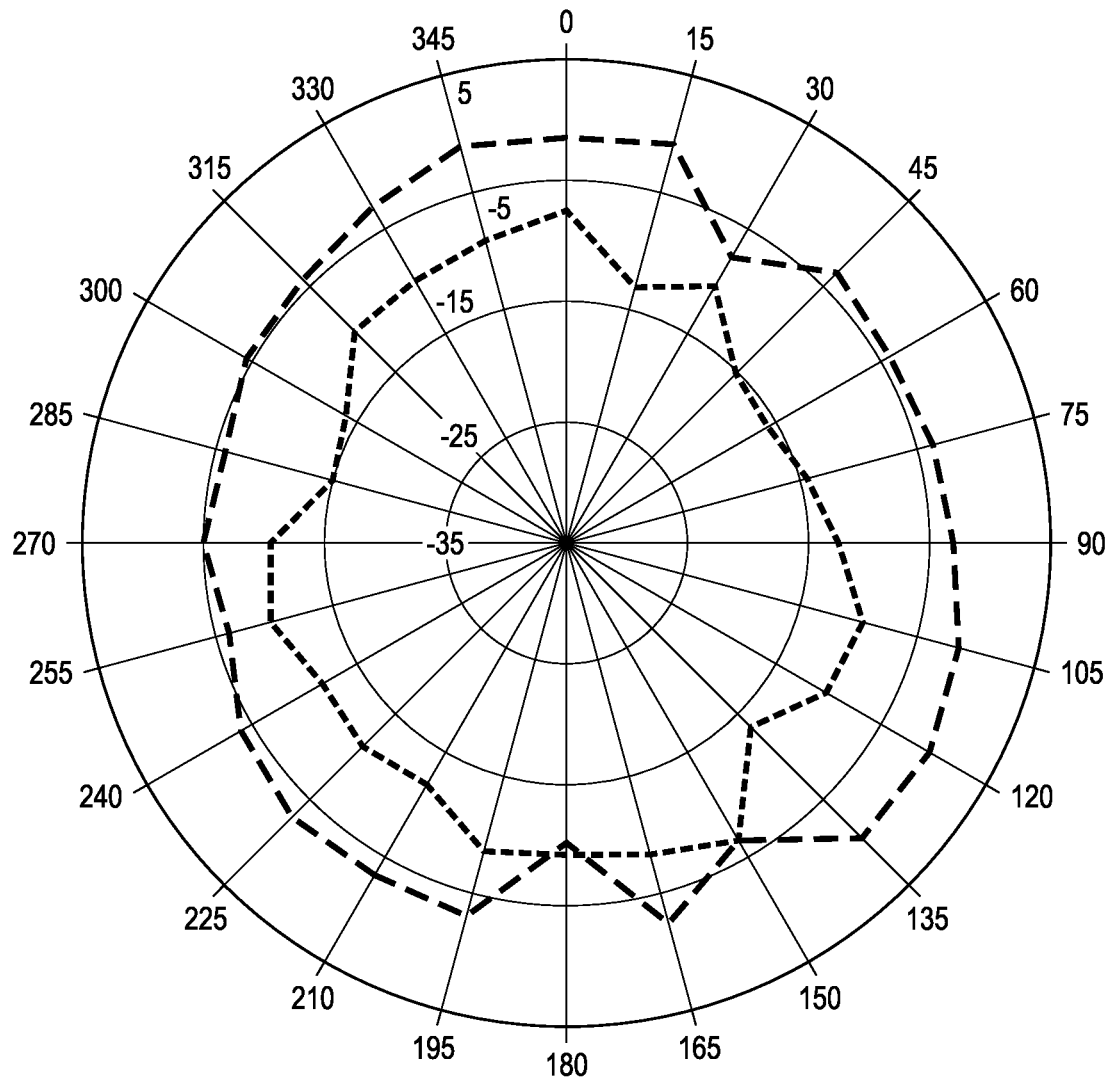
FIGS. 9A and 9B show examples of antenna performance along a Z Y axis in an open mode of operation and a closed mode of operation according to an embodiment of the present disclosure.
Figure 9A:
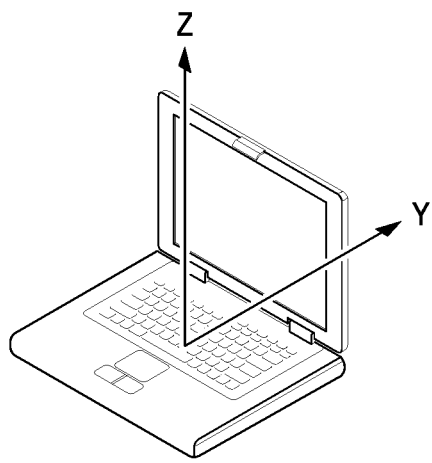
Figure 9B:
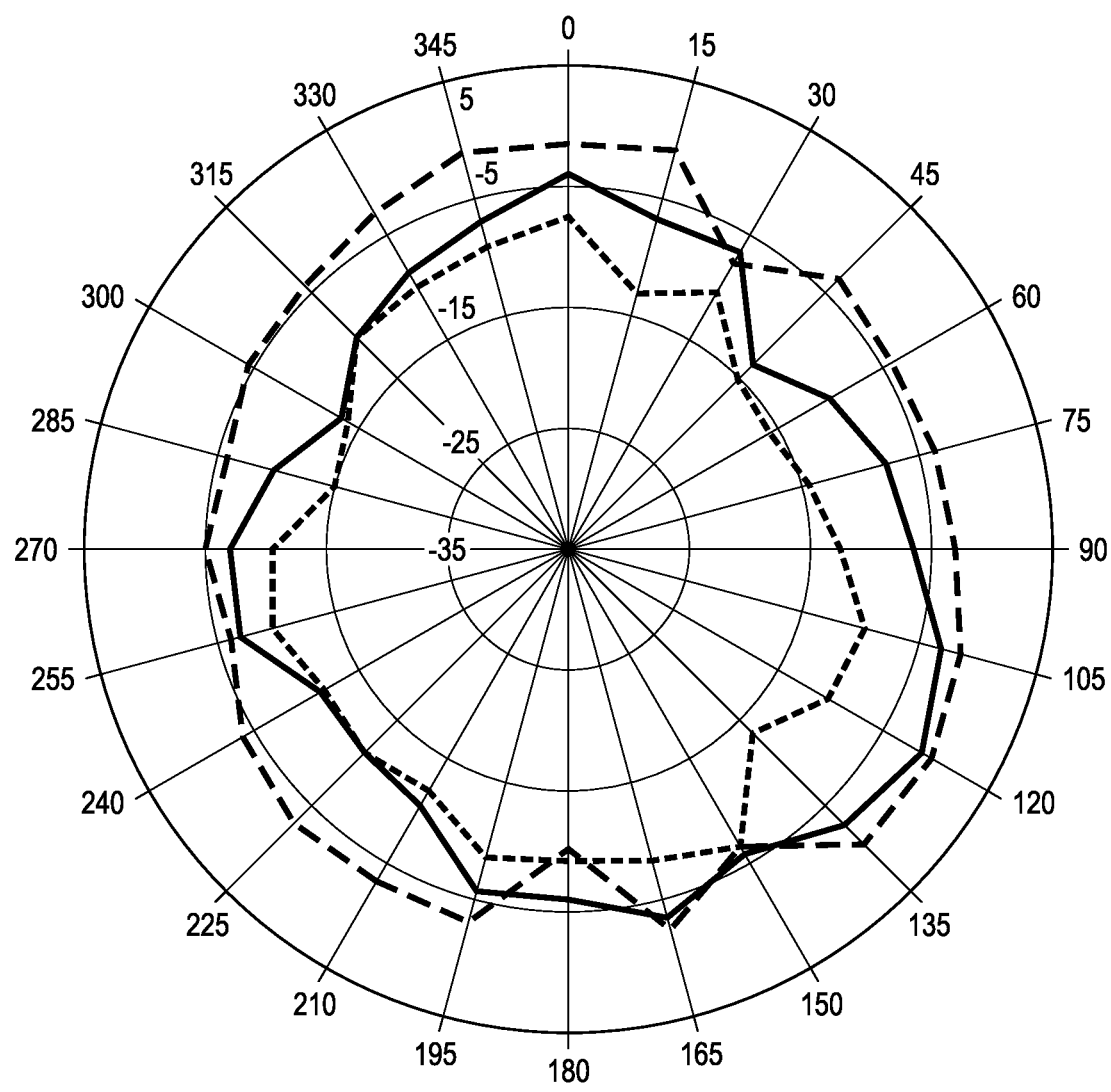

FIGS. 9A and 9B show examples of antenna performance in an open mode of operation and a closed mode of operation according to an embodiment of the present disclosure. Specifically, FIG. 9A shows directional antenna performance along an Z Y axis for a known information handling system and FIG. 9B shows directional antenna performance an Z Y axis for an information handling system which includes integrated closed mode switch mechanism in accordance with the present disclosure.

When referred to as a "device," a "module," a "unit," a "controller," or the like, the embodiments described herein can be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCMCIA) card, or other such expansion card), or a system (such as a motherboard, a system-on-a-chip (SoC), or a stand-alone device).

In accordance with various embodiments of the present disclosure, the methods described herein may be implemented by software programs executable by a computer system. Further, in an exemplary, non-limited embodiment, implementations can include distributed processing, component/object distributed processing, and parallel processing. Alternatively, virtual computer system processing can be constructed to implement one or more of the methods or functionality as described herein.

The present disclosure contemplates a computer-readable medium that includes instructions or receives and executes instructions responsive to a propagated signal; so that a device connected to a network can communicate voice, video or data over the network. Further, the instructions may be transmitted or received over the network via the network interface device.

While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding or carrying a set of instructions for execution by a processor or that cause a computer system to perform any one or more of the methods or operations disclosed herein.

In a particular non-limiting, exemplary embodiment, the computer-readable medium can include a solid-state memory such as a memory card or other package that houses one or more non-volatile read-only memories.

Further, the computer-readable medium can be a random access memory or other volatile re-writable memory. Additionally, the computer-readable medium can include a magneto-optical or optical medium, such as a disk or tapes or other storage device to store information received via carrier wave signals such as a signal communicated over a transmission medium. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The above-disclosed subject matter is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A closed mode switch mechanism comprising:
an antenna controller;
an antenna coupled to the antenna controller;
an antenna closed mode switch system coupled to the antenna controller and the antenna, the antenna closed mode switch system providing antenna impedance matching for the antenna when an information handling system is configured in a closed mode of operation;
an auxiliary antenna coupled to the antenna controller; and,
an auxiliary closed mode switch system coupled to the antenna controller and the auxiliary antenna, the auxiliary antenna closed mode switch system providing antenna impedance matching for the auxiliary antenna when an information handling system is configured in a closed mode of operation.

2. The closed mode switch mechanism of claim 1, wherein:
the antenna closed mode switch system comprises an open mode electrical component portion and a closed mode electrical component portion, the open mode electrical component portion being configured to provide antenna impedance matching when the information handling system is configured in an open mode of operation.

3. The closed mode switch mechanism of claim 2, wherein:
the antenna closed mode switch system comprises a switch, the antenna controller controlling the switch to couple one of the open mode electrical component portion and the closed mode electrical component portion to the antenna controller.

4. The closed mode switch mechanism of claim 2, wherein,
the open mode electrical component portion comprises a plurality of open mode electrical components; and,
the closed mode electrical component portion comprises a plurality of closed mode electrical components.

5. The closed mode switch mechanism of claim 4 wherein:
at least one of the plurality of open mode electrical components has a different value than at least one of the plurality of closed mode electrical components.

6. A system comprising:
a host portion, the host portion comprising
a processor; and,
a data bus coupled to the processor;
an antenna system, the antenna system comprising
an antenna controller;
an antenna coupled to the antenna controller;
an antenna closed mode switch system coupled to the antenna controller and the antenna, the antenna closed mode switch system providing antenna impedance matching for the antenna when an information handling system is configured in a closed mode of operation;
an auxiliary antenna coupled to the antenna controller; and,
an auxiliary closed mode switch system coupled to the antenna controller and the auxiliary antenna, the auxiliary antenna closed mode switch system providing antenna impedance matching for the auxiliary antenna when an information handling system is configured in a closed mode of operation.

7. The system of claim 6, wherein:
the antenna closed mode switch system comprises an open mode electrical component portion and a closed mode electrical component portion, the open mode electrical component portion being configured to provide antenna impedance matching when the information handling system is configured in an open mode of operation.

8. The system of claim 7, wherein:

the antenna closed mode switch system comprises a switch, the antenna controller controlling the switch to couple one of the open mode electrical component portion and the closed mode electrical component portion to the antenna controller.

9. The system of claim 7, wherein:

the open mode electrical component portion comprises a plurality of open mode electrical components; and, the closed mode electrical component portion comprises a plurality of closed mode electrical components.

10. The system of claim 9, wherein:

at least one of the plurality of open mode electrical components has a different value than at least one of the plurality of closed mode electrical components.

\* \* \* \* \*